US008119450B2

(12) United States Patent
Ahmad et al.

(10) Patent No.: US 8,119,450 B2
(45) Date of Patent: Feb. 21, 2012

(54) INTERCONNECTING A CHIP AND A SUBSTRATE BY BONDING PURE METAL BUMPS AND PURE METAL SPOTS

(75) Inventors: Nazir Ahmad, San Jose, CA (US);
Young-Do Kweon, Cupertino, CA (US);
Samuel Tam, Daly City, CA (US);
Kyung-Moon Kim, Kyoung ki-do (KR);
Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 31 days.

(21) Appl. No.: 12/472,083

(22) Filed: May 26, 2009

(65) Prior Publication Data

US 2009/0227072 A1    Sep. 10, 2009

Related U.S. Application Data

(63) Continuation of application No. 11/444,894, filed on Jun. 1, 2006, now abandoned.

(51) Int. Cl.
*H01L 21/00* (2006.01)
*H01L 21/44* (2006.01)

(52) U.S. Cl. ........ 438/108; 438/127; 438/615; 438/661; 257/E23.023; 257/E23.026

(58) Field of Classification Search .................. 438/108, 438/615, 661, 127; 257/E23.023, E23.026
See application file for complete search history.

(56) References Cited

U.S. PATENT DOCUMENTS

| 4,208,005 A | 6/1980 | Nate et al. |
| 4,875,617 A | 10/1989 | Citowsky |
| 5,210,938 A | 5/1993 | Hirai |
| 5,250,469 A | 10/1993 | Tanaka et al. |
| 5,346,857 A * | 9/1994 | Scharr et al. ............. 228/180.22 |
| 5,386,624 A | 2/1995 | George et al. |
| 5,421,507 A * | 6/1995 | Davis et al. .................... 228/194 |
| 5,428,996 A * | 7/1995 | Abbink et al. ............. 73/514.36 |
| 5,508,561 A | 4/1996 | Tago et al. |
| 5,713,508 A * | 2/1998 | Gaynes et al. ................ 228/175 |
| 5,717,477 A | 2/1998 | Fritz et al. |
| 5,801,350 A | 9/1998 | Shibuya et al. |
| 5,829,126 A | 11/1998 | Nagao et al. |

(Continued)

FOREIGN PATENT DOCUMENTS

EP    0461378 A2    12/1991

(Continued)

*Primary Examiner* — Kevin Parendo
(74) *Attorney, Agent, or Firm* — Robert D. Atkins; Patent Law Group

(57) ABSTRACT

A method for forming metallurgical interconnections and polymer adhesion of a flip chip to a substrate includes providing a chip having a set of bumps formed on a bump side thereof and a substrate having a set of interconnect points on a metallization thereon, providing a measured quantity of a polymer adhesive in a middle region of the chip on the bump side, aligning the chip with the substrate so that the set of bumps aligns with the set of interconnect points, pressing the chip and the substrate toward one another so that a portion of the polymer adhesive contacts the substrate and the bumps contact the interconnect points, and heating the bumps to a temperature sufficiently high to form a metallurgical connection between the bumps and the interconnect points. Also, a flip chip package is made by the method. The metallurgical connection includes an alloy of gold and tin at the interface between the bumps and the interconnect points.

18 Claims, 1 Drawing Sheet

U.S. PATENT DOCUMENTS

| | | | |
|---|---|---|---|
| 5,863,815 | A | 1/1999 | Egawa |
| 5,865,365 | A | 2/1999 | Nishikawa et al. |
| 5,869,904 | A | 2/1999 | Shoji |
| 5,874,780 | A | 2/1999 | Murakami |
| 5,892,289 | A | 4/1999 | Tokuno |
| 5,931,371 | A | 8/1999 | Pao et al. |
| 5,953,814 | A | 9/1999 | Sozansky et al. |
| 5,959,362 | A | 9/1999 | Yoshino |
| 5,977,633 | A | 11/1999 | Suzuki et al. |
| 6,037,192 | A | 3/2000 | Witzman et al. |
| 6,100,597 | A * | 8/2000 | Nakamura ............ 257/787 |
| 6,130,476 | A | 10/2000 | LaFontaine, Jr. et al. |
| 6,153,940 | A | 11/2000 | Zakel et al. |
| 6,162,660 | A * | 12/2000 | LaFontaine et al. ......... 438/108 |
| 6,173,887 | B1 | 1/2001 | Mead et al. |
| 6,214,642 | B1 | 4/2001 | Chen et al. |
| 6,225,144 | B1 | 5/2001 | How et al. |
| 6,330,967 | B1 | 12/2001 | Milewski et al. |
| 6,337,522 | B1 | 1/2002 | Kang et al. |
| 2001/0045637 | A1 | 11/2001 | Farquhar et al. |

FOREIGN PATENT DOCUMENTS

| | | |
|---|---|---|
| JP | 08-031870 | 2/1996 |
| JP | 09-213702 | 8/1997 |
| JP | 09-246423 | 9/1997 |
| JP | 10-242208 | 9/1998 |
| JP | 11-274241 | 10/1999 |
| JP | 11307585 | 11/1999 |
| JP | 2001-015641 | 1/2001 |
| JP | 2001-035882 | 2/2001 |
| WO | 199904430 A1 | 1/1999 |

* cited by examiner

INTERCONNECTING A CHIP AND A SUBSTRATE BY BONDING PURE METAL BUMPS AND PURE METAL SPOTS

CLAIM TO DOMESTIC PRIORITY

The present application is a continuation of U.S. application Ser. No. 11/444,894, filed Jun. 1, 2006, which is a continuation of U.S. application Ser. No. 09/802,375, filed Mar. 9, 2001, which claims the benefit of U.S. Provisional Application No. 60/188,568, filed Mar. 10, 2000.

CROSS REFERENCE TO RELATED APPLICATIONS

This application is related to commonly assigned copending U.S. application Ser. No. 09/802,664, now U.S. Pat. No. 6,815,252, filed on Mar. 9, 2001, and to U.S. application Ser. No. 09/802,443, now U.S. Pat. No. 6,828,220, filed on Mar. 9, 2001, which applications are incorporated herein by reference.

BACKGROUND OF THE INVENTION

This invention relates to flip chip packaging and, more particularly, to providing a Au/Sn alloy interconnection between a chip and a substrate.

Conventional methods for interconnecting a flip chip to a substrate include an Anisotropic Conductive Film (ACF) with Ni or Ni/Au coated polymer particles in which a contact type interconnection is made. Fragments of the polymer film which remain trapped at the interconnection point often lead to poor electrical contact and reduced reliability of the package. Additionally, the polymer film reduces the reliability of the bonding interface during the chip bonding process. Conventional flip chip techniques that use either ACF, Non-Conductive Adhesive (NCA) or Non Conductive Polymer (NCP) also suffer from problems in curing the adhesive on adjacent bonding sites on a substrate during the chip bonding process.

What is needed is a flip chip structure and method that provides for metallurgical interconnection between the flip chip and the substrate and that further provides for improved bonding between the chip and the substrate.

BRIEF SUMMARY OF THE INVENTION

In one general aspect the invention features a method for providing metallurgic connection between a flip chip and a substrate, by providing a chip having a set of bumps formed on a bump side thereof, providing a substrate having a set of interconnect points on a metallization thereon, providing a measured quantity of a polymer adhesive in a middle region of the chip on the bump side, aligning the chip with the substrate so that the set of bumps aligns with the set of interconnect points, pressing the chip and the substrate toward one another so that a portion of the polymer adhesive contacts the substrate and the bumps contact the interconnect points, and heating the bumps to a temperature sufficiently high to form a metallurgical connection between the bumps and the interconnect points.

In some embodiments the bumps are stud bumps, and are formed of gold; and the interconnect points include spots of tin, preferably pure tin, on the metallization. In other embodiments the bumps are formed of a metal such as, for example, copper plated with Au or with Ni/Au or electroless Ni/Au; and the interconnect points also may include such materials. In embodiments in which the stud bumps are made of Au and the interconnect points are spots of Sn, the heating step raises the temperature of the bumps sufficiently to create an alloy between the Au and the Sn in a bonding phase at the interface; in preferred embodiments the bonding phase comprises a 80:20 Au:Sn alloy. For such an alloy the bumps may be sufficiently heated by heating the die to a temperature greater than about 200° C., preferably about 232° C.

In some embodiments the method further includes underfilling with a polymer.

In another general aspect the invention features a chip package structure made according to the method.

In another general aspect the invention features a chip package structure including a chip having a bumps formed thereon and a substrate having interconnect points on a metallization thereon, the bumps forming contacts with the interconnect points, in which an alloy is formed at an interface between the material of each bump and the material of the interconnect in contact with the bump.

In some embodiments a cured adhesive polymer is situated in a middle region between the bump surface of the chip and the surface of the substrate.

In some embodiments the bump material is gold or is a metal such as copper plated with gold or with Ni/Au or with electroless Ni/Au; and the interconnect points also include such materials. In some embodiments the alloy at the interface is an alloy of Au and Sn, and preferably the alloy is a 20:80 Sn:Au alloy.

DETAILED DESCRIPTION OF THE INVENTION

A description of an exemplary embodiment of the invention follows. Using the disclosure herein, substantially conventional apparatus can be modified for use in the process of the invention.

Figure 1A:
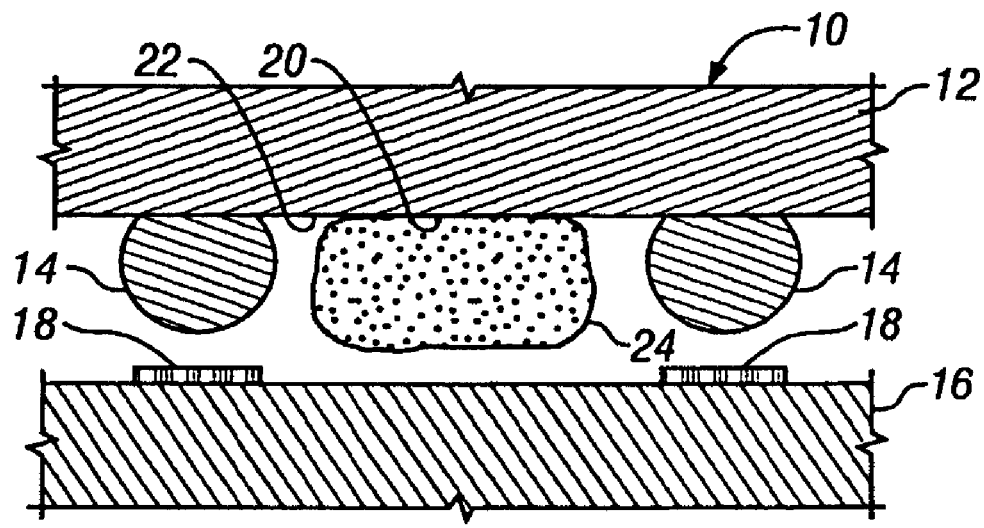
FIGS. 1A and 1B are diagrammatic sketches in a sectional view showing an illustrative embodiment of stages according to the invention for making a packaging structure according to the invention.
Figure 1B:
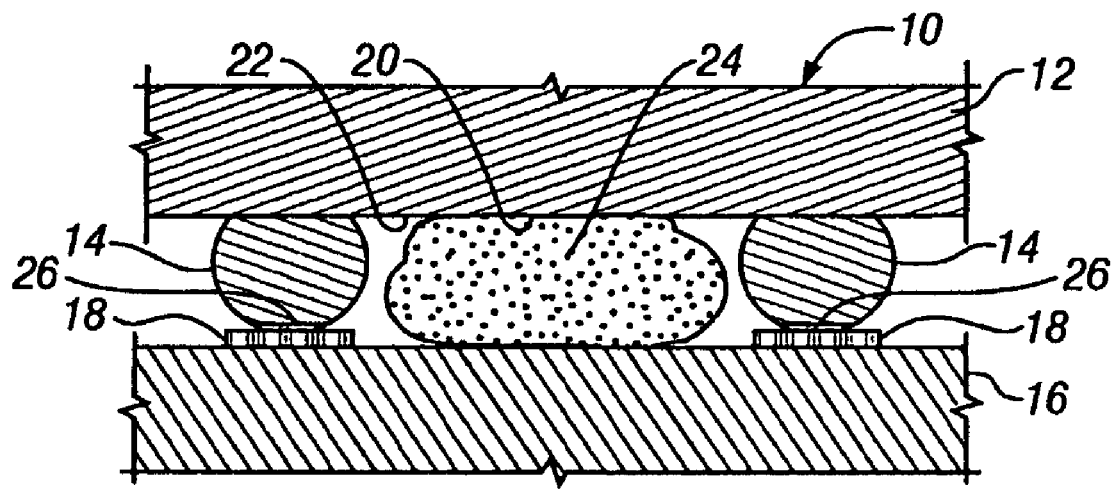

With reference to the Figs., there are shown in FIG. 1A a chip and a substrate in alignment prior to forming the interconnect according to the invention, and in FIG. 1B a completed interconnect. The flip chip configuration, shown generally at 10, includes a plurality of bumps, e.g. 14, formed on the chip 12, the bumps preferably being gold (Au) stud bumps. The corresponding interconnection points, on a standard substrate 16 metallization are provided with a plurality of preferably pure tin (Sn) spots 18. A central area 20 of the chip on a bump side 22 further includes a spot of adhesive 24 small enough that it does not spread to the gold studs and the interconnection area during a subsequent bonding process. As the chip is connected to the substrate in the flip chip format, the adhesive holds the chip to the substrate and the ends of the stud bumps 14 react with the pure tin spots 18 on the substrate to make metallurgical interconnections 26.

A substrate strip populated with a row or an array of chips assembled in this manner can be molded using simple tooling, readily adapted from conventional equipment. The molding preferably provides die underfilling and molding compound along the perimeters of the die simultaneously. Solder balls can then be attached and the completed chips can be singularized by, for example, sawing the substrate.

The flip chip is aligned with the substrate in such a manner that the gold stud bumps on the chip align with the tin spots on the substrate. After alignment and contact between the Sn spots and the Au stud bumps, the die is heated to a temperature and for a time sufficient to give a metallurgical reaction at the interface between the bumps and the spots, preferably in excess of about 200° C. For an Au—Sn junction, a suitable temperature is about 232° C., and a suitable time is 1-2 seconds. At this temperature, the Sn spots melt and the temperature at the bonding interface increases significantly, thereby dissolving some Au from both a metallization layer on the substrate and the stud bumps to create a bonding phase at the interface between the Sn spots and the Au stud bumps. Preferably a 80%:20% Au:Sn alloy composition is formed at the interface. Such an alloy provides both reliable electrical contact and advantageous mechanical properties.

As the Sn/Au interconnection is made the adhesive spot cures to hold the die in place. A subsequent underfilling process of the structure is thereby facilitated as the center region of the chip is already filled with the adhesive polymer. Overmolding fills the remaining space under the die and the space between the chips, resulting in a robust structure.

An alternative embodiment provides for direct contact between the gold stud bumps and a standard metallization on the substrate. A metallization bondable to withstand the stresses of subsequent processing is thereby formed as there is no interposing polymer at the bonding interface during the chip bonding process.

To achieve wafer scale packaging, a wafer having stud bumps thereon is placed face up on a heating stage. Substrate pieces, inspected and singulated, with appropriate amounts of adhesive are then picked, aligned, placed and bonded to wafer sites applying conventional process conditions of temperature and pressure. Ultrasonic scrubbing may be employed to clean the substrate site before thermal compression bonding. The disclosed process provides for little waste of substrate material as only particular rejected sites will be discarded, rather than the entire substrate strip. Additionally, it is not necessary to bond to the rejected dies on the wafer. After fully populating the wafer, the wafer is molded for underfilling and interchip space filling. Dicing the wafer then follows the molding and solder ball mounting steps to singulate the dies.

In alternative embodiments the stud bumps include Cu plated with Ni and Au, plated Au or electroless Ni/Au, and these materials may be also provided on the bonding sites of the substrate. With the advances in Cu terminal metallurgy, the bonding sites may be finished with Ni and heavy soft Au, thereby providing for interconnections between the wafer and substrate I/Os either by thermal compression bonding utilizing Au or by fusion at low temperatures utilizing Sn like metals to form suitable bonding phases. Once metallurgical contacts are formed, the structure is underfilled and transfer molded simultaneously.

Other embodiments are within the following claims.

What is claimed is:

1. A method of interconnecting a chip to a substrate, the method comprising:
    forming bumps with a first metal that is devoid of any other metals, the bumps being formed on a first surface of the chip;
    forming spots with a second metal that is devoid of any other metals, the spots being formed on a first surface of the substrate;
    contacting each one of the bumps to a different spot to form bonding interfaces, wherein contacting comprises applying an adhesive to the first surface of the chip, and adhering the first surface of the chip to the first surface of the substrate with the adhesive;
    heating each bonding interface to a melting point of the second metal to melt a portion of the second metal from each of the spots;
    metallurgically reacting the first and second metals at the melting point of the second metal to increase the temperature at each bonding interface above the melting point of the second metal; and
    creating a bonding phase at each bonding interface in response to the increased temperature, and curing the adhesive as the bonding phases at each bonding interface are created.

2. The method of claim 1, wherein adhering the first surface of the chip to the first surface of the substrate with the adhesive comprises preventing the adhesive from spreading to the bumps or to the spots.

3. The method of claim 1, wherein forming the bumps on the chip with the first metal that is devoid of any other metals comprises forming the bumps with pure gold.

4. The method of claim 1, wherein forming the spots on the substrate with the second metal that is devoid of any other metals comprises forming the spots with pure tin.

5. The method of claim 1, wherein heating each bonding interface to the melting point of the second metal comprises heating each bonding interface to a temperature of 232 degrees C. for a duration of 1 to 2 seconds.

6. The method of claim 1, wherein forming the spots comprises forming the spots such that a width of the spots is no greater than a width of the bumps.

7. A method of interconnecting a chip to a substrate to form a package, the method comprising:
    forming bumps with a first metal that is devoid of any other metals, the bumps being formed on a first surface of the chip;
    forming spots with a second metal that is devoid of any other metals, the spots being formed on a first surface of the substrate;
    contacting each one of the bumps to a different spot to form bonding interfaces, wherein the chip and the substrate are held together with a spot adhesive applied to the first surface of the chip such that the spot adhesive does not contact the bumps or the spots;
    heating each bonding interface to a melting point of the second metal to melt a portion of the second metal from each of the spots;
    curing the spot adhesive to hold the chip on the substrate, the curing occurring during the heating of each bonding interface;
    metallurgically reacting the first and second metals at the melting point of the second metal to increase a temperature at each bonding interface above the melting point of the second metal;
    creating a bonding phase at each bonding interface in response to the increased temperature to bond the chip to the substrate; and
    underfilling and overmolding the bonded chip and substrate with an adhesive polymer to form the package.

8. The method of claim 7, wherein forming the bumps on the chip with the first metal that is devoid of any other metals comprises forming the bumps with pure gold.

9. The method of claim 7, wherein forming the spots on the substrate with the second metal that is devoid of any other metals comprises forming the spots with pure tin.

10. The method of claim 7, wherein heating each bonding interface to the melting point of the second metal comprises heating each bonding interface to a temperature of 232 degrees C. for a duration of 1 to 2 seconds.

11. The method of claim 7, wherein metallurgically reacting the first and second metals at the melting point of the second metal to increase the temperature at each bonding interface above the melting point of the second metal comprises dissolving a portion of the first metal from each of the bumps.

12. The method of claim 11, wherein creating the bonding phase at each bonding interface in response to the increased temperature comprises mixing a dissolved portion of the first metal with a molten portion of the second metal.

13. The method of claim 12, wherein creating the bonding phase at each bonding interface in response to the increased temperature further comprises mixing the first metal with the second metal in the bonding interface to create a 4:1 alloy composition.

14. The method of claim 13, wherein the 4:1 alloy composition comprises 80% of the first metal and 20% of the second metal.

15. The method of claim 7, wherein forming the spots comprises forming the spots such that a width of the spots is no greater than a width of the bumps.

16. A method of interconnecting a chip to a substrate, the method comprising:
    forming bumps with a first metal that is devoid of any other metals, the bumps formed on a first surface of the chip, the first metal consisting of gold (Au);
    forming spots with a second metal that is devoid of any other metals, the second metal consisting of tin (Sn), the spots formed on a first surface of the substrate, a width of each of the spots no greater than a width of a corresponding bump;
    contacting each of the spots to the corresponding bump to form bonding interfaces, wherein contacting comprises applying a polymer adhesive to the first surface of the chip and adhering the first surface of the chip to the first surface of the substrate with the polymer adhesive such that the polymer adhesive remains in a center area of the chip and does not contact the bumps or the spots;
    heating each bonding interface to a temperature of about 232 degrees C. for a duration of not less than 1 second and not more than 2 seconds to melt a portion of the second metal from each of the spots, wherein the polymer adhesive is simultaneously cured during the heating such that the chip is held in place on the substrate;
    metallurgically reacting the first metal and the second metal at the melting point of the second metal to increase a temperature at each bonding interface above the melting point of the second metal, wherein metallurgically reacting the first metal and the second metal comprises dissolving a portion of the first metal from ends of the bumps; and
    creating a bonding phase at no region other than each bonding interface in response to the increased temperature, wherein creating the bonding phase comprises mixing a molten portion of the second metal from each of the spots with a dissolved portion of the first metal from the end of the corresponding bump to create a Au/Sn alloy composition of about 4:1.

17. A method of interconnecting a chip to a substrate, the method comprising:
    forming bumps with a first metal that consists of gold (Au), the bumps formed on a first surface of the chip;
    forming spots with a second metal that consists of tin (Sn), the spots formed on a first surface of the substrate, a width of each of the spots no greater than a width of a corresponding bump;
    contacting each of the spots to the corresponding bump to form bonding interfaces, wherein contacting comprises applying adhesive to the first surface of the chip and adhering the first surface of the chip to the first surface of the substrate with the adhesive such that the polymer adhesive remains in a center area of the chip and does not contact the bumps or the spots;
    heating each bonding interface to a melting point of the second metal for a duration of not less than 1 second and not more than 2 seconds to melt a portion of the second metal from each of the spots, wherein the adhesive cures simultaneously during the heating such that the chip is held in place on the substrate;
    metallurgically reacting the bumps and the spots at the melting point of the second metal to increase a temperature at each bonding interface above the melting point of the second metal, wherein metallurgically reacting the bumps and the spots comprises dissolving a portion of the first metal from ends of the bumps; and
    creating a bonding phase only at each bonding interface in response to the increased temperature, wherein creating the bonding phase comprises mixing a dissolved portion of the first metal from the ends of the bumps with a molten portion of the second metal.

18. The method of claim 17, wherein creating the bonding phase further comprises mixing the dissolved portion of the first metal with the molten portion of the second metal to create a Au/Sn alloy composition of about 4:1.

* * * * *

UNITED STATES PATENT AND TRADEMARK OFFICE
CERTIFICATE OF CORRECTION

| | |
|---|---|
| PATENT NO. | : 8,119,450 B2 |
| APPLICATION NO. | : 12/472083 |
| DATED | : February 21, 2012 |
| INVENTOR(S) | : Nazir Ahmad et al. |

It is certified that error appears in the above-identified patent and that said Letters Patent is hereby corrected as shown below:

Title Page Related U.S. Application Data should read:

(63) The present application is a continuation of U.S. Application No. 11/444,894, filed June 1, 2006, which is a continuation of U.S. Application No. 09/802,375, filed March 9, 2001, which claims the benefit of U.S. Provisional Application No. 60/188,568, filed March 10, 2000.

Signed and Sealed this
Eighth Day of May, 2012

David J. Kappos
*Director of the United States Patent and Trademark Office*